(12) United States Patent
Li

(10) Patent No.: US 7,656,148 B1
(45) Date of Patent: Feb. 2, 2010

(54) OVER-POWER DETECTOR

(75) Inventor: Kan Li, Singapore (SG)

(73) Assignee: Marvell International Ltd., Hamilton (BM)

( * ) Notice: Subject to any disclaimer, the term of this patent is extended or adjusted under 35 U.S.C. 154(b) by 193 days.

(21) Appl. No.: 11/881,923

(22) Filed: Jul. 30, 2007

Related U.S. Application Data

(60) Provisional application No. 60/822,151, filed on Aug. 11, 2006.

(51) Int. Cl.
*G01R 11/63* (2006.01)

(52) U.S. Cl. .................................................. 324/103 R

(58) Field of Classification Search ............. 324/103 R, 324/103 P, 142, 771; 361/60–90; 327/63–73
See application file for complete search history.

(56) References Cited

U.S. PATENT DOCUMENTS

| | | | | |
|---|---|---|---|---|
| 5,369,541 A * | 11/1994 | Normet | ........................ | 361/85 |
| 5,479,336 A * | 12/1995 | Motoki et al. | .................. | 363/89 |
| 5,712,581 A * | 1/1998 | Kaylor | ......................... | 327/74 |
| 5,718,414 A * | 2/1998 | Deloach et al. | ................ | 256/24 |
| 5,825,656 A * | 10/1998 | Moore et al. | ................... | 702/60 |
| 5,890,097 A * | 3/1999 | Cox | ............................ | 702/67 |
| 5,923,219 A * | 7/1999 | Ide et al. | ...................... | 330/308 |
| 6,034,856 A * | 3/2000 | Kather et al. | ................. | 361/87 |
| 6,188,264 B1 * | 2/2001 | Masuta et al. | ................ | 327/316 |
| 6,198,401 B1 * | 3/2001 | Newton et al. | .............. | 340/635 |
| 6,774,617 B2 * | 8/2004 | Andoh | ..................... | 324/103 P |
| 6,798,188 B2 * | 9/2004 | Dathe et al. | .............. | 324/103 P |
| 6,909,082 B2 * | 6/2005 | Doh et al. | ............. | 250/214 AG |
| 6,927,563 B2 * | 8/2005 | Lau | ............................ | 324/127 |
| 7,050,913 B2 * | 5/2006 | Cox | ............................ | 702/60 |
| 7,061,225 B2 * | 6/2006 | Yang et al. | ................ | 324/103 P |
| 7,173,397 B2 * | 2/2007 | Kinoshita et al. | ........... | 320/134 |
| 7,362,593 B2 * | 4/2008 | Yang et al. | ................ | 363/21.16 |
| 2002/0008505 A1 * | 1/2002 | Chen et al. | .............. | 324/103 R |

* cited by examiner

*Primary Examiner*—Ha Tran T Nguyen
*Assistant Examiner*—Joshua Benitez

(57) ABSTRACT

An over-power detector for detecting an over-power condition of an electronic apparatus powered by power from an AC power source. The over-power detector includes an over-current detector for detecting whether current used by the apparatus exceeds a settable current threshold. The current threshold is set based on a detection of peak voltage on the AC power source, such that the output of the over-current detector is representative of an over-power condition.

9 Claims, 8 Drawing Sheets

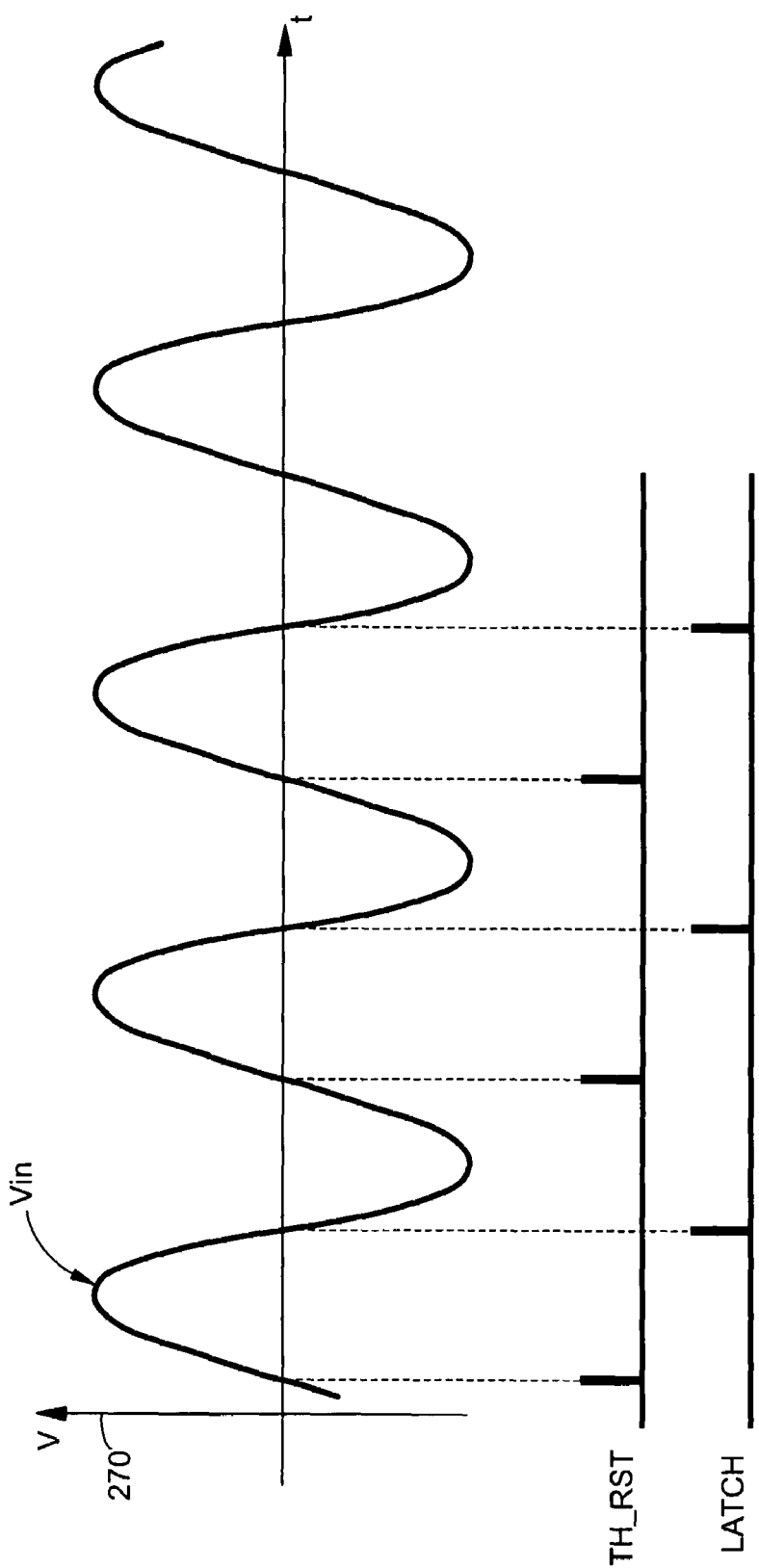

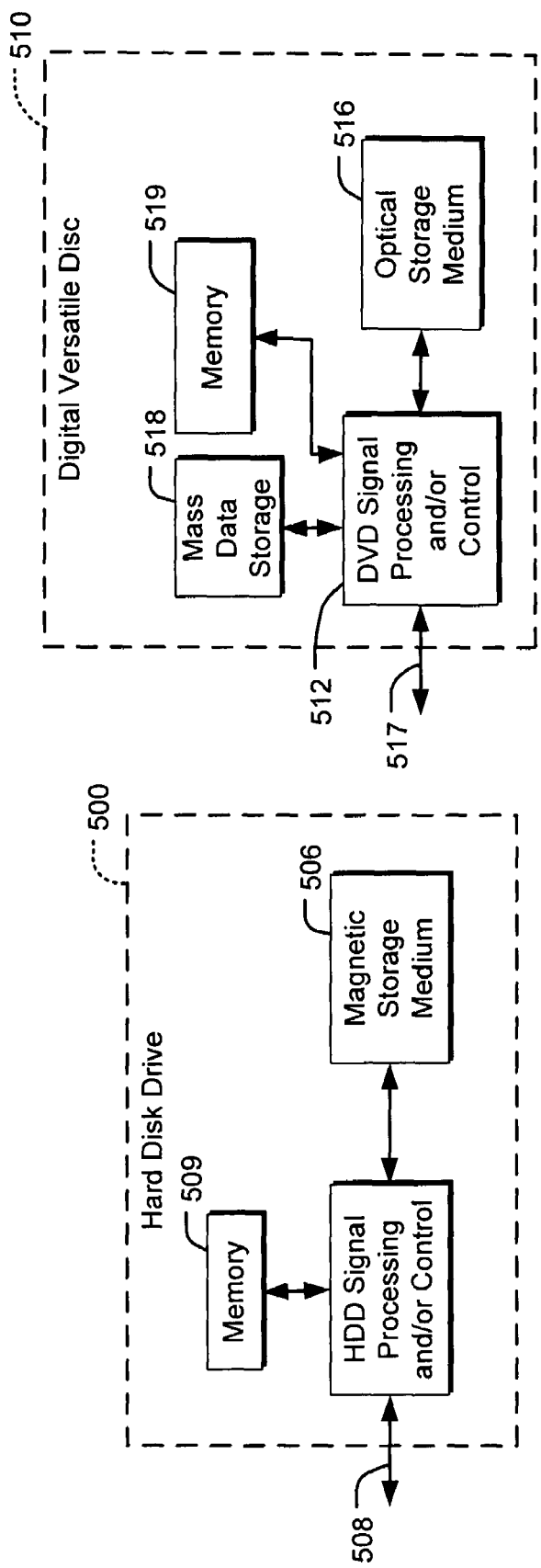

OVER-POWER DETECTOR

CROSS-REFERENCE TO RELATED APPLICATION

This application claims the benefit of U.S. Provisional Patent Application No. 60/822,151, filed Aug. 11, 2006, the contents of which are hereby incorporated by reference as if fully stated herein.

FIELD OF THE INVENTION

The present invention relates to a detector for detecting an over-power condition of an apparatus powered by power from an AC power source.

BACKGROUND OF THE INVENTION

In monitoring the operational state of an electrical apparatus, it is often useful to monitor the power used by the apparatus. This is particularly true of electrical apparatuses that are designed to operate with electrical power supplies of differing voltages, such as apparatuses designed to operate at either 120 v of U.S. commercial power supplies or 240 v of European power commercial supplies. For such apparatuses, it is insufficient to monitor only the current used, since the current might be acceptable at one voltage level whereas the same current would be unacceptably high at another voltage level.

Detecting power, however, is not straightforward, since it involves a multiplication of current by voltage. Multipliers in general are complicated to fabricate, and to fabricate accurately. Moreover, the very concept of multiplication becomes unclear when it is considered that most commercial power supplies provide an alternating AC current.

SUMMARY OF THE INVENTION

The present invention addresses these difficulties by providing an over-power detector for detecting an over-power condition of an electrical apparatus such as an apparatus designed to work with different voltage levels of an AC power source.

The invention herein is particularly useful in situations where a numerical value of actual power is not necessarily needed, but rather it is sufficient to detect an over-power condition where some power threshold has been exceeded. The invention herein is also particularly simple to implement since the over-power detection can ordinarily be accomplished without resort to multipliers.

Thus, in one aspect, the invention provides an over-power detector for detecting an over-power condition of an electrical apparatus powered by power from an AC power source. A voltage peak detector detects a peak voltage of the AC power source, and outputs a signal indicative of the level thereof. For example, the voltage peak detector might output an N-valued signal such as a 4-valued signal, wherein each value represents a different one of N possible levels of the peak voltage.

The over-power detector further includes an over-current detector for detecting whether current used by the apparatus exceeds a settable current threshold. The threshold is set in accordance with the signal output by the voltage peak detector. As one example, the over-current detector might include a comparator for comparing current used by the apparatus with one of N different levels of current, each of the different levels corresponding to the N-valued signal output by the voltage peak detector.

Because the threshold of the over-current detector is settable based on the level of the peak voltage detected by the voltage peak detector, and since power is the product of current multiplied by voltage, the invention is able to detect over-power conditions for a variety of different supply voltage, ordinarily without the need for a multiplier for multiplying voltage used by the apparatus by current used thereby.

This brief summary has been provided so that the nature of the invention may be understood quickly. A more complete understanding of the invention can be obtained by reference to the following detailed description of the preferred embodiment thereof in connection with the attached drawings.

BRIEF DESCRIPTION OF THE DRAWINGS

FIG. 2A is a chart showing decoder outputs of decoder 19 in FIG. 1.

FIG. 4 is a timing view for explaining latching and reset signals for FIG. 1.

FIG. 5 is a chart showing decoder outputs for decoder 32 in FIG. 1.

FIG. 6A is a block diagram showing an embodiment of the invention in a hard disk drive.

FIG. 6B is a block diagram of the invention in a DVD drive.

DETAILED DESCRIPTION OF THE PREFERRED EMBODIMENT

Figure 1:
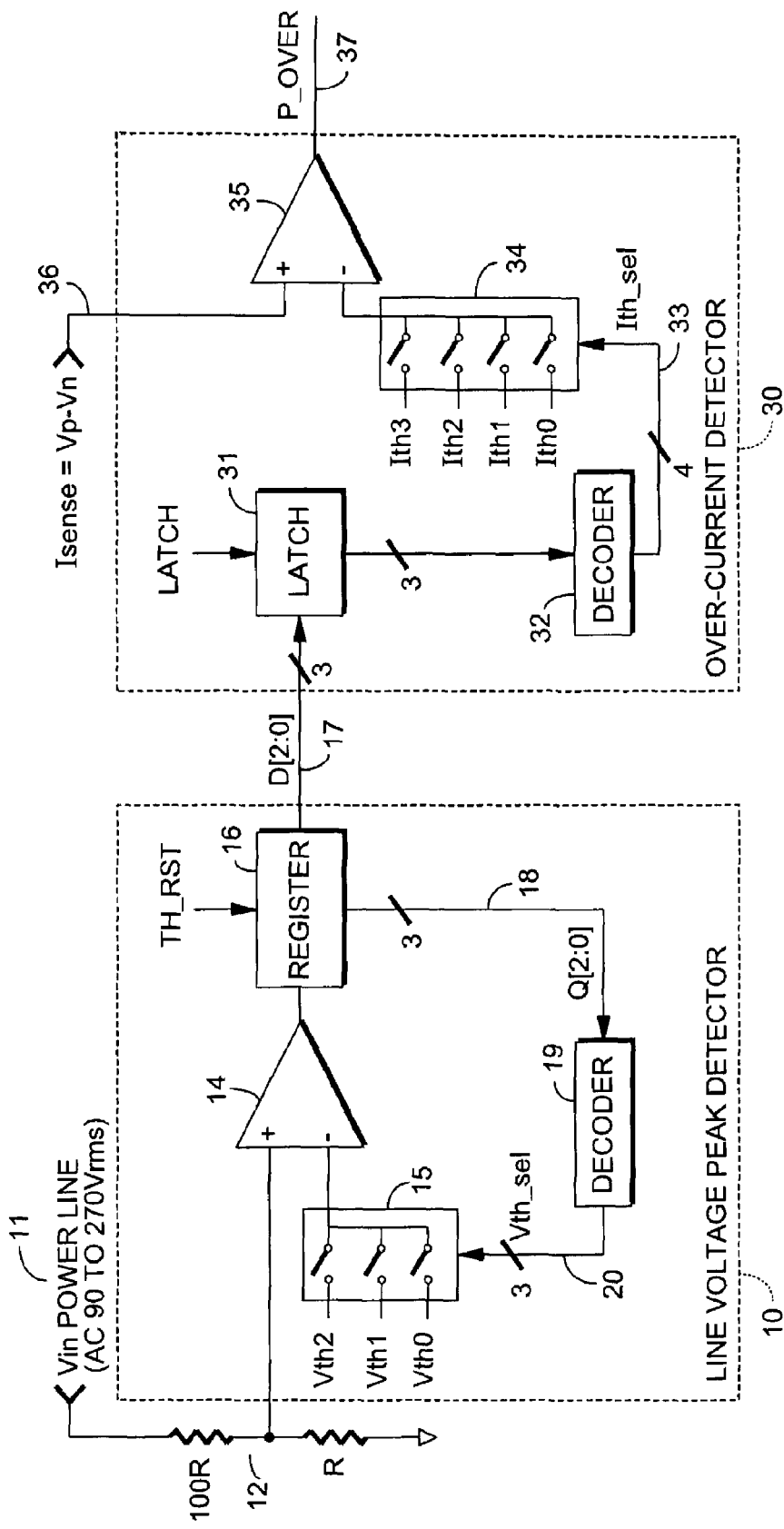
FIG. 1 is an illustrative schematic view of a preferred embodiment of the invention.

FIG. 1 illustrates a schematic view of an over-power detector according to a preferred embodiment of the invention, for detecting an over-power condition of an unshown apparatus powered by power from an AC power source. The over-power detector is constructed from two fundamental components: line voltage peak detector 10, and over-current detector 30. Line voltage peak detector 10 is constructed so that it detects a peak voltage of power on an AC power source 11, and outputs a signal indicative of the level of the peak voltage. Over-current detector 30 is constructed to detect whether current used by the apparatus exceeds a settable threshold, wherein the threshold is set in accordance with the signal output by line voltage peak detector 10. More detailed explanations are provided hereinbelow.

Referring to line voltage peak detector 10, AC voltage on an AC power source 11 has an as-yet unknown peak voltage which varies in accordance with the type of commercial power source, such as between 90 and 270 v RMS. A sample of the AC power source voltage is obtained at 11, and the sample is divided by resistor divider network 12 down to approximately 1/100 of its input value. The divided voltage is provided to the positive input of op-amp 14.

The negative input to op-amp 14 is provided by selector 15. Selector 15 provides one of three different selectable voltage thresholds, namely, Vth0, Vth1 or Vth2. As a consequence of this connection, op-amp 14 acts as a comparator, and outputs a positive voltage each time the divided voltage of the AC power supply 11 exceeds the voltage threshold selected by selector 15. Moreover, because the AC voltage is a cyclically varying voltage, op-amp 14 outputs a positive voltage once per cycle, as soon as the divided voltage from divider network 12 exceeds the selected threshold.

The comparator output from op-amp 14 is provided to register 16, which functions as a binary sequence counter. Briefly, and as will be explained in more detail in connection with FIG. 2, register 16 responds to positive comparator output voltages from op-amp 14, and sequences through a binary bit pattern. The binary bit pattern is output at pattern Q[2:0] 18, which in this embodiment is a three-bit pattern. In addition, register 16 outputs a delayed binary bit pattern D[2:0] 17 which is the same as Q output 18 but delayed by a few nanoseconds.

The Q output 18 from register 16 is provided to decoder 19, which decodes the output into a three-bit selector pattern Vth_sel 20. Binary signal Vth_sel 20 is a three-bit binary signal, with each bit corresponding to one of the voltage thresholds selectable by selector 15.

Figure 2:
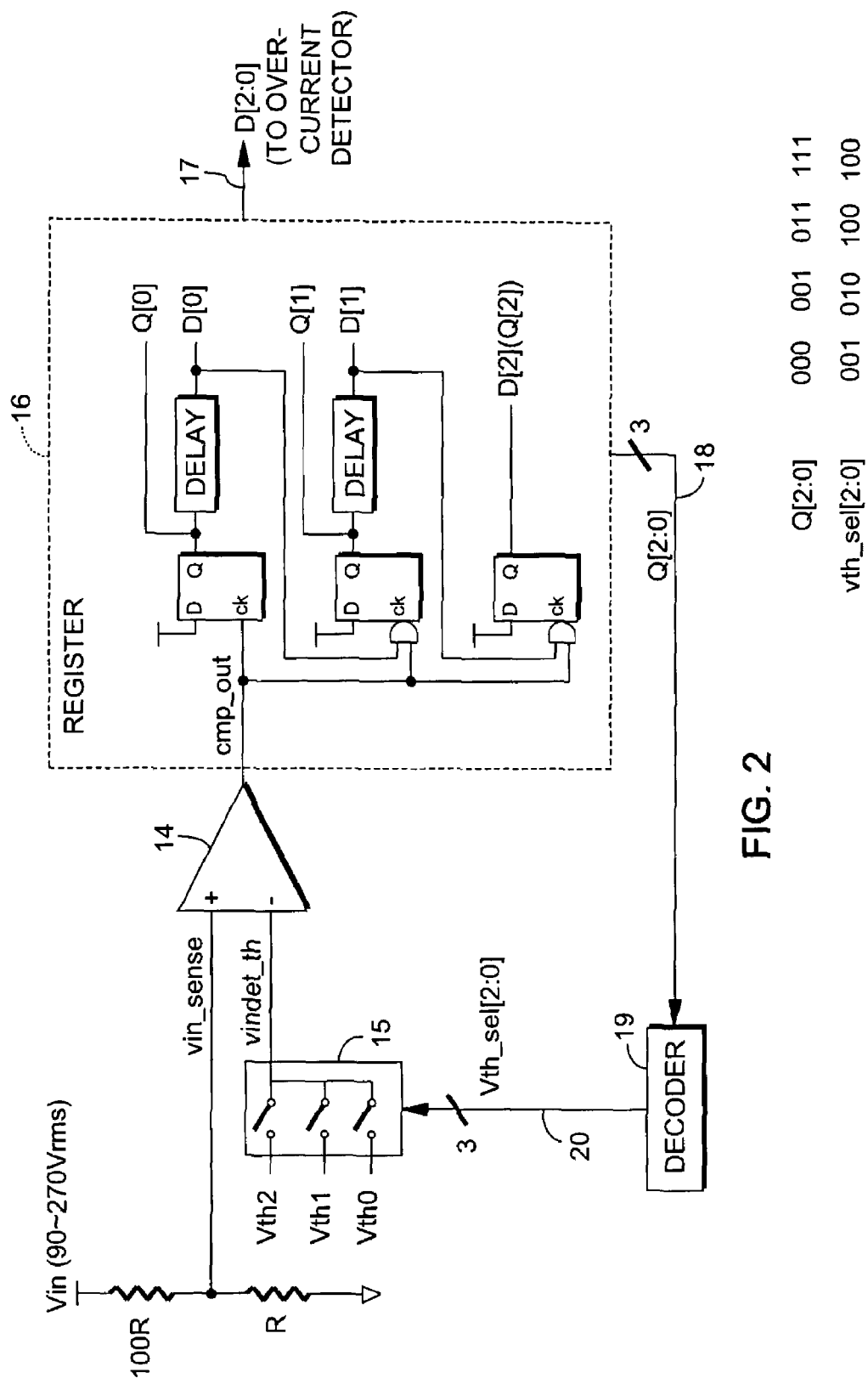
FIG. 2 is a detailed schematic view for explaining the construction of register 16 in FIG. 1.

FIG. 2 is a detailed view of register 16. As seen in FIG. 2, register 16 is constructed from multiple D-type flip flops together with multiple delays, interconnected in a network so as to provide a binary sequence of bits in accordance with on the comparator output of op-amp 14. The D input to each of the flip flops is tied to a voltage high signal, and the clock input of each flip flop is clocked based in part on the comparator output of op-amp 14. The delays are provided so as to output the delayed signal D 17, and also to condition logical NAND gates which control whether the comparator output of op-amp 14 is or is not applied to the clock inputs of the D-type flip flops.

The binary sequential output from register 16 is depicted in the chart shown at FIG. 2A. As seen there, before any comparator signals are received from op-amp 14, the binary bit pattern of register 16 is all 0. As each successive comparator output is received, register 16 sequences through binary bit patterns such that Q output 18 takes on the following sequential values:

000→001→211→111

After the final binary sequential pattern of Q[2:0]=111 is achieved, further comparator signals from op-amp 14 do not affect the output of register 16, which remains at Q[2:0]=111.

FIG. 2A also shows the decoded output of decoder 19, which provides selector signal Vth_sel to selector 15 based on the Q output 18 from register 16. As seen in FIG. 2A, when Q output 18 is 000, Vth_sel[2:0]=001. This corresponds to a selection by selector 15 of voltage threshold Vth0. Likewise, each successive decoded output from decoder 19 selects successive ones of Vth0, Vth1 and Vth2.

The operation of line voltage peak detector 10 will now be explained with respect to the timing diagram shown in FIG. 3. In this timing diagram, and as a representative example, it is assumed that the AC power source voltage 11 is a 270 v RMS voltage. 270 v RMS is the maximum value supplied from any known commercial AC power source. The reason why this explanation relies on a maximum voltage of 270 v RMS, is that a maximum voltage will allow illustration of all possible output states of register 16. It will be understood that if the AC power source voltage 11 is less than 270 v RMS, then the binary sequence output by register 16 will stop at an intermediate point, corresponding to the actual peak voltage on AC power source 11.

Figure 3:
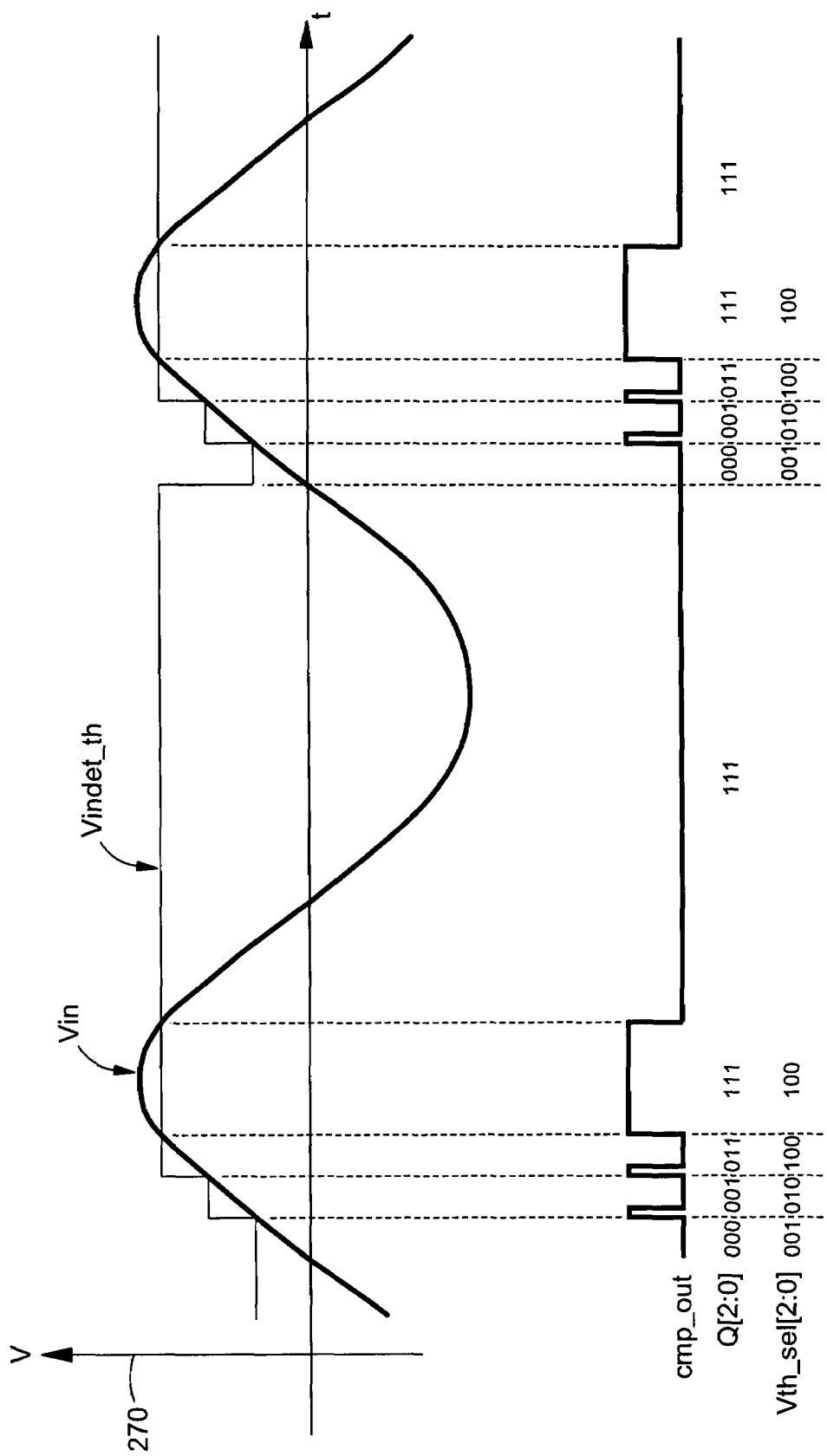
FIG. 3 is a timing diagram for showing operation of the line voltage peak detector in FIG. 1.

It should further be understood that the voltage input Vin shown in FIG. 3 is not provided directly to op-amp 14. Rather, and as explained above, the voltage provided to op-amp 14 is a divided voltage through resistor divider network 12, such that the actual voltage provided to op-amp 14 is approximately 1/100 of the input voltage Vin.

As seen in FIG. 3, at the commencement of operation, Q[2:0]=000. As a consequence, decoder 19 outputs a decoded threshold selector signal of Vth_sel [2:0]=001. This causes selector 15 to select the lowest voltage threshold, namely, Vth0, which is provided as the negative input to op-amp 14.

Meanwhile, the AC voltage signal Vin has begun to rise through its periodic alternating cycle, and at some point reaches a voltage that exceeds Vth0. At this point, op-amp 14 outputs a positive comparator signal, which is depicted in FIG. 3 as cmp_out. In response to this positive comparator output, register 16 sequences to the next sequential value of its binary sequential output, such that Q output 18 attains its next sequential value of Q[2:0]=001. In correspondence to this output, decoder 19 decodes the Q value 18 so as to obtain a decoded output value of Vth_sel[2:0]=010. This causes selector 15 to select the next voltage threshold, namely, Vth1. Thus, as seen in FIG. 3, the voltage provided to the negative input of op-amp 14 increases in correspondence to the value of Vth1. Because Vin is a relatively slower signal, when Vth1 is provided to the negative input of op-amp 14, cmp_out will immediately go low. Thus, as shown in FIG. 3, at this time, cmp_out is simply a pulse.

Meanwhile, Vin continues to rise. When Vin again exceeds the new threshold of Vth1, op-amp 14 outputs a positive comparator output cmp_out. This causes register 16 to sequence to its next binary sequential output, such that Q output 18 attains a value of Q[2:0]=011. In correspondence to this new value, decoder 19 outputs a selector value of Vth_sel [2:0]=100. This selector value causes selector 15 to output the maximum threshold voltage of Vth2, which is provided as the negative input to op-amp 14. Again, because Vin is a relatively slower signal, when Vth1 is provided to the negative input of op-amp 14, cmp_out will immediately go low. Thus, as shown in FIG. 3, at this time, cmp_out is simply a pulse.

Meanwhile, the AC voltage Vin continues to rise and soon exceeds the new voltage threshold of Vth2. At that point in time, op-amp 14 will output a positive comparative signal, which is fed to register 16. Register 16 sequences to its next sequential binary output of Q[2:0]=111. Decoder 19 decodes this value, but as shown in the chart of FIG. 2A, the decoded output remains the same such that Vth_sel[2:0]=100. Thus, the same voltage threshold Vth2 is selected by selector 15, and there are no further changes. At this time, instead of a pulse, cmp_out will maintain its high value, until such time as Vin_sense is lower than Vth2.

In this way, line voltage peak detector 10 outputs a signal indicative of the level of the peak voltage of AC power source 11. As indicated above, the output is not Q output 18, which is used internally by line voltage peak detector 10, but rather is D output 17. The D output 17 is provided to over-current detector 30.

Reverting to FIG. 1, over-current detector 30 is constructed from latch 31 which latches D output 17 from line voltage peak detector 10. The latched output is provided to decoder 32, which decodes the three-bit latched output into a four-bit pattern 33. The four-bit pattern 33 is provided as a selector signal to selector 34. Selector 34 provides one of four different voltages which are selected in correspondence to current thresholds Ith0 through Ith3. The selected voltage is provided as the negative input to op-amp 35, which is connected as a comparator. The positive input to op-amp 35 is a voltage level 36 which corresponds to actual current being used by the device under test. As one example, a resistor may be used to sense the current of the power supply. The voltage across the resistor is taken as the Isense input for comparator 35.

By virtue of the foregoing construction, a threshold is set in over-current detector 30 based on the D output 17 from line voltage peak detector 10. As a consequence, a current threshold can be set against which the actual current used by the device (Isense) is tested. If the sensed current exceeds the selected threshold, then an alarm signal such as p_over 37 is output, indicating an over-power condition. It should be understood that because the current threshold is selected based on the actual peak voltage of the AC power source, and since power is the product of current multiplied by voltage, over-current detector 30 is actually providing an over-power detection.

FIG. 4 is a timing diagram showing the timings by which a threshold reset signal and a latch signal are generated. As shown in FIG. 4, a threshold reset signal TH_RST is generated as a pulse corresponding to the positive-going zero crossing of the input voltage Vin. Likewise, the latch signal for latch 31 is provided as a pulse corresponding to the negative-going zero crossing of voltage Vin. Thus, the thresholds of register 16 are reset based on the positive-going zero crossing of the voltage Vin. The TH_RST signal will reset the D[2:0] outputs of D output 17, but the input to decoder 32 is not reset until the LATCH signal is triggered. Likewise, the latch signals for latch 31 are generated based on the negative-going zero crossing of voltage Vin, which causes latch 31 to latch D output 17 from line voltage peak detector 10 at the negative-going zero crossing.

FIG. 5 is a chart showing the decoder output of decoder 32. As seen in FIG. 5, the decoder output provides a four-bit binary signal, with one bit corresponding to each of the four thresholds Ith0 through Ith3. In correspondence to the binary sequence of D output 17, the selector signal for the current threshold takes on the following sequential operational outputs:

0001→0010→0100→1000

Figure 6D:
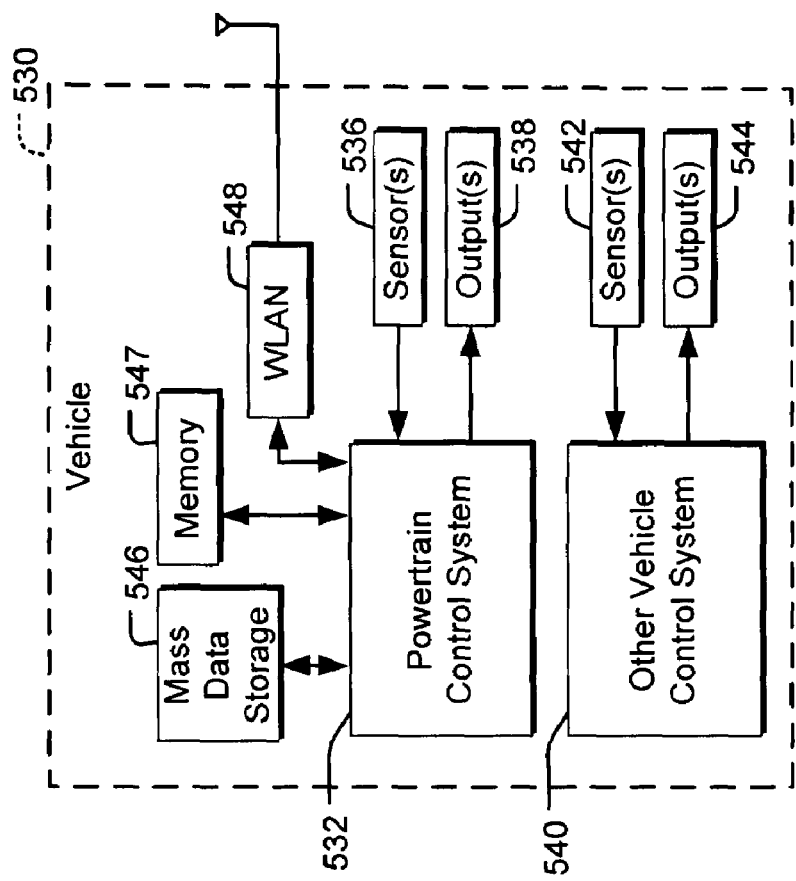
FIG. 6D is a block diagram of the invention in a vehicle control system.

Referring now to FIGS. 6A-6G, various exemplary implementations of the present invention are shown. Referring to FIG. 6A, the present invention may be embodied as an over-power detector in a hard disk drive 500. The present invention may implement either or both signal processing and/or control circuits, which are generally identified in FIG. 6A at 502. In some implementations, signal processing and/or control circuit 502 and/or other circuits (not shown) in HDD 500 may process data, perform coding and/or encryption, perform calculations, and/or format data that is output to and/or received from a magnetic storage medium 506.

HDD 500 may communicate with a host device (not shown) such as a computer, mobile computing devices such as personal digital assistants, cellular phones, media or MP3 players and the like, and/or other devices via one or more wired or wireless communication links 508. HDD 500 may be connected to memory 509, such as random access memory (RAM), a low latency nonvolatile memory such as flash memory, read only memory (ROM) and/or other suitable electronic data storage.

Referring now to FIG. 6B, the present invention may be embodied as an over-power detector in a digital versatile disc (DVD) drive 510. The present invention may implement either or both signal processing and/or control circuits, which are generally identified in FIG. 6B at 512, and/or mass data storage 518 of DVD drive 510. Signal processing and/or control circuit 512 and/or other circuits (not shown) in DVD 510 may process data, perform coding and/or encryption, perform calculations, and/or format data that is read from and/or data written to an optical storage medium 516. In some implementations, signal processing and/or control circuit 512 and/or other circuits (not shown) in DVD 510 can also perform other functions such as encoding and/or decoding and/or any other signal processing functions associated with a DVD drive.

DVD drive 510 may communicate with an output device (not shown) such as a computer, television or other device via one or more wired or wireless communication links 517. DVD 510 may communicate with mass data storage 518 that stores data in a nonvolatile manner. Mass data storage 518 may include a hard disk drive (HDD) such as that shown in FIG. 6A. The HDD may be a mini HDD that includes one or more platters having a diameter that is smaller than approximately 1.8"DVD 510 may be connected to memory 519, such as RAM, ROM, low latency nonvolatile memory such as flash memory, and/or other suitable electronic data storage.

Figure 6C:
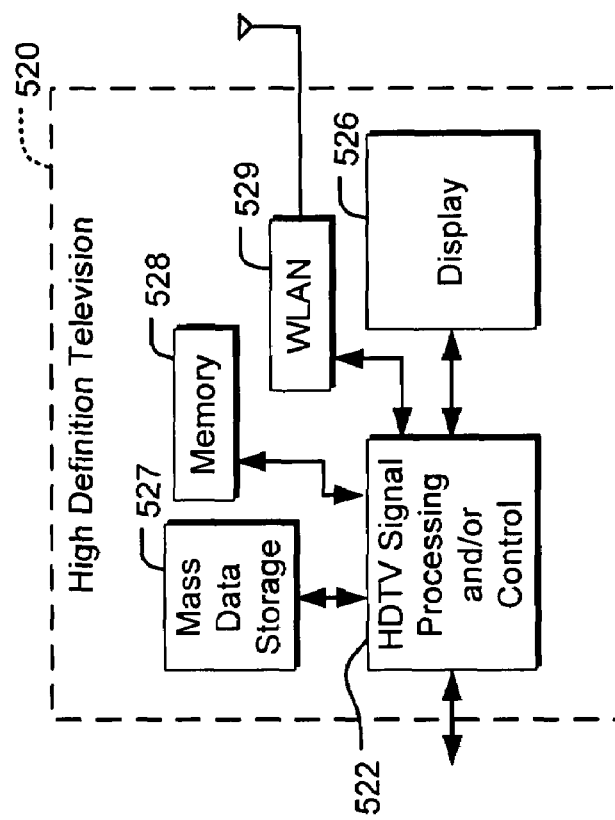
FIG. 6C is a block diagram of the invention in a high definition television (HDTV).

Referring now to FIG. 6C, the present invention may be embodied as an over-power detector in a high definition television (HDTV) 520. The present invention may implement either or both signal processing and/or control circuits, which are generally identified in FIG. 6C at 522, a WLAN interface and/or mass data storage of the HDTV 520. HDTV 520 receives HDTV input signals in either a wired or wireless format and generates HDTV output signals for a display 526. In some implementations, signal processing circuit and/or control circuit 522 and/or other circuits (not shown) of HDTV 520 may process data, perform coding and/or encryption, perform calculations, format data and/or perform any other type of HDTV processing that may be required.

HDTV 520 may communicate with mass data storage 527 that stores data in a nonvolatile manner such as optical and/or magnetic storage devices. At least one HDD may have the configuration shown in FIG. 6A and/or at least one DVD may have the configuration shown in FIG. 6B. The HDD may be a mini HDD that includes one or more platters having a diameter that is smaller than approximately 1.8"HDTV 520 may be connected to memory 528 such as RAM, ROM, low latency nonvolatile memory such as flash memory and/or other suitable electronic data storage. HDTV 520 also may support connections with a WLAN via a WLAN network interface 529.

Referring now to FIG. 6D, the present invention may be embodied as an over-power detector in a control system of a vehicle 530, a WLAN interface and/or mass data storage of the vehicle control system. In some implementations, the present invention implements a powertrain control system 532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 540 of vehicle 530. Control system 540 may likewise receive signals from input sensors 542 and/or output control signals to one or more output devices 544. In some implementations, control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 532 may communicate with mass data storage 546 that stores data in a nonvolatile manner. Mass data storage 546 may include optical and/or magnetic storage devices for example hard disk drives HDD and/or DVDs. At least one HDD may have the configuration shown in FIG. 3A and/or at least one DVD may have the configuration shown in FIG. 6B. The HDD may be a mini HDD that includes one or more platters having a diameter that is smaller than approximately 1.8"Powertrain control system 532 may be connected to memory 547 such as RAM, ROM, low latency nonvolatile memory such as flash memory and/or other suitable electronic data storage. Powertrain control system 532 also may support connections with a WLAN via a WLAN network interface 548. The control system 540 may also include mass data storage, memory and/or a WLAN interface (all not shown).

Figure 6E:
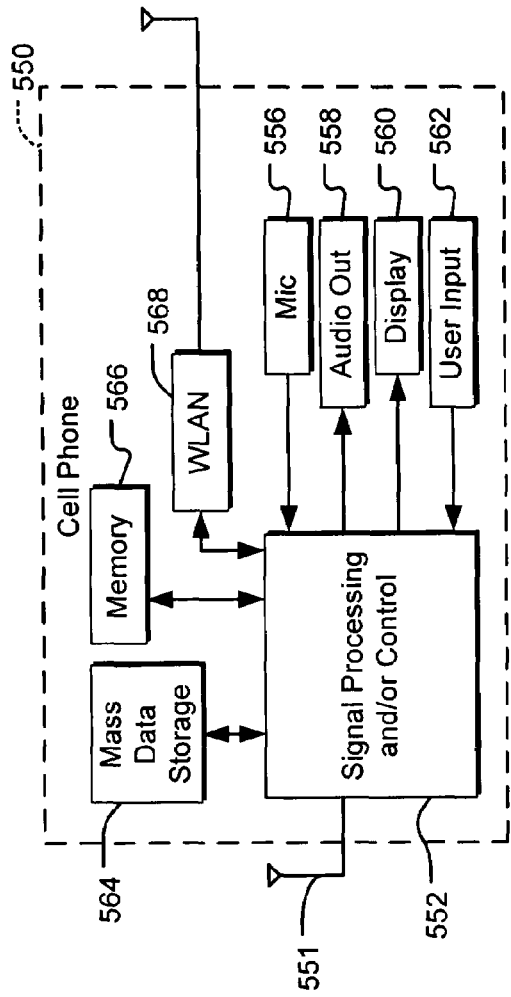
FIG. 6E is a block diagram of the invention in a cellular or mobile phone.

Referring now to FIG. 6E, the present invention may be embodied as an over-power detector in a cellular phone 550 that may include a cellular antenna 551. The present invention may implement either or both signal processing and/or control circuits, which are generally identified in FIG. 6E at 552, a WLAN interface and/or mass data storage of the cellular phone 550. In some implementations, cellular phone 550 includes a microphone 556, an audio output 558 such as a speaker and/or audio output jack, a display 560 and/or an input device 562 such as a keypad, pointing device, voice actuation and/or other input device. Signal processing and/or control circuits 552 and/or other circuits (not shown) in cellular phone 550 may process data, perform coding and/or encryption, perform calculations, format data and/or perform other cellular phone functions.

Cellular phone 550 may communicate with mass data storage 564 that stores data in a nonvolatile manner such as optical and/or magnetic storage devices for example hard disk drives HDD and/or DVDs. At least one HDD may have the configuration shown in FIG. 3A and/or at least one DVD may have the configuration shown in FIG. 6B. The HDD may be a mini HDD that includes one or more platters having a diameter that is smaller than approximately 1.8"Cellular phone 550 may be connected to memory 566 such as RAM, ROM, low latency nonvolatile memory such as flash memory and/or other suitable electronic data storage. Cellular phone 550 also may support connections with a WLAN via a WLAN network interface 568.

Figure 6F:
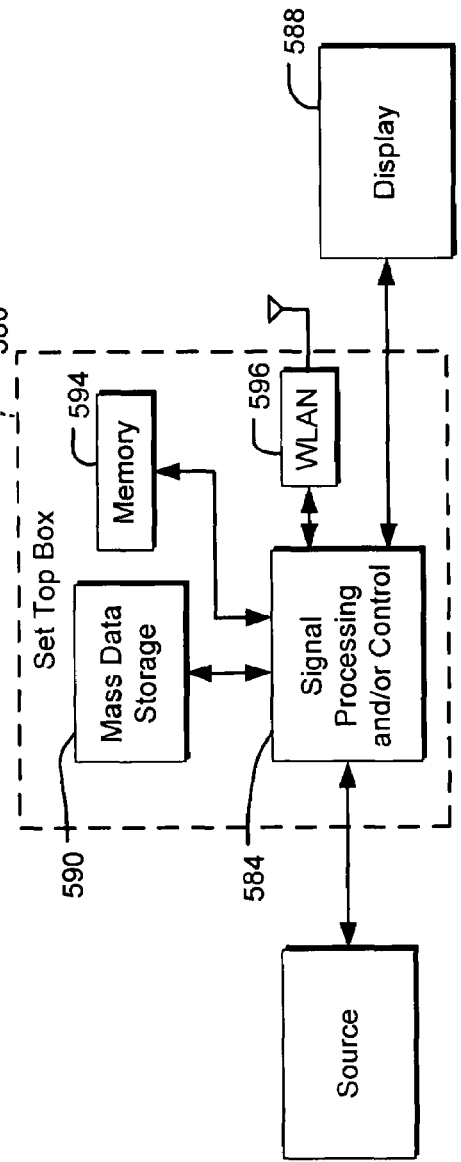
FIG. 6F is a block diagram of the invention in a set-top box (STB).

Referring now to FIG. 6F, the present invention may be embodied as an over-power detector in a set top box 580. The present invention may implement either or both signal processing and/or control circuits, which are generally identified in FIG. 6F at 584, a WLAN interface and/or mass data storage of the set top box 580. Set top box 580 receives signals from a source such as a broadband source and outputs standard and/or high definition audio/video signals suitable for a display 588 such as a television and/or monitor and/or other video and/or audio output devices. Signal processing and/or control circuits 584 and/or other circuits (not shown) of the set top box 580 may process data, perform coding and/or encryption, perform calculations, format data and/or perform any other set top box function.

Set top box 580 may communicate with mass data storage 590 that stores data in a nonvolatile manner. Mass data storage 590 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8"Set top box 580 may be connected to memory 594 such as RAM, ROM, low latency nonvolatile memory such as flash memory and/or other suitable electronic data storage. Set top box 580 also may support connections with a WLAN via a WLAN network interface 596.

Figure 6G:
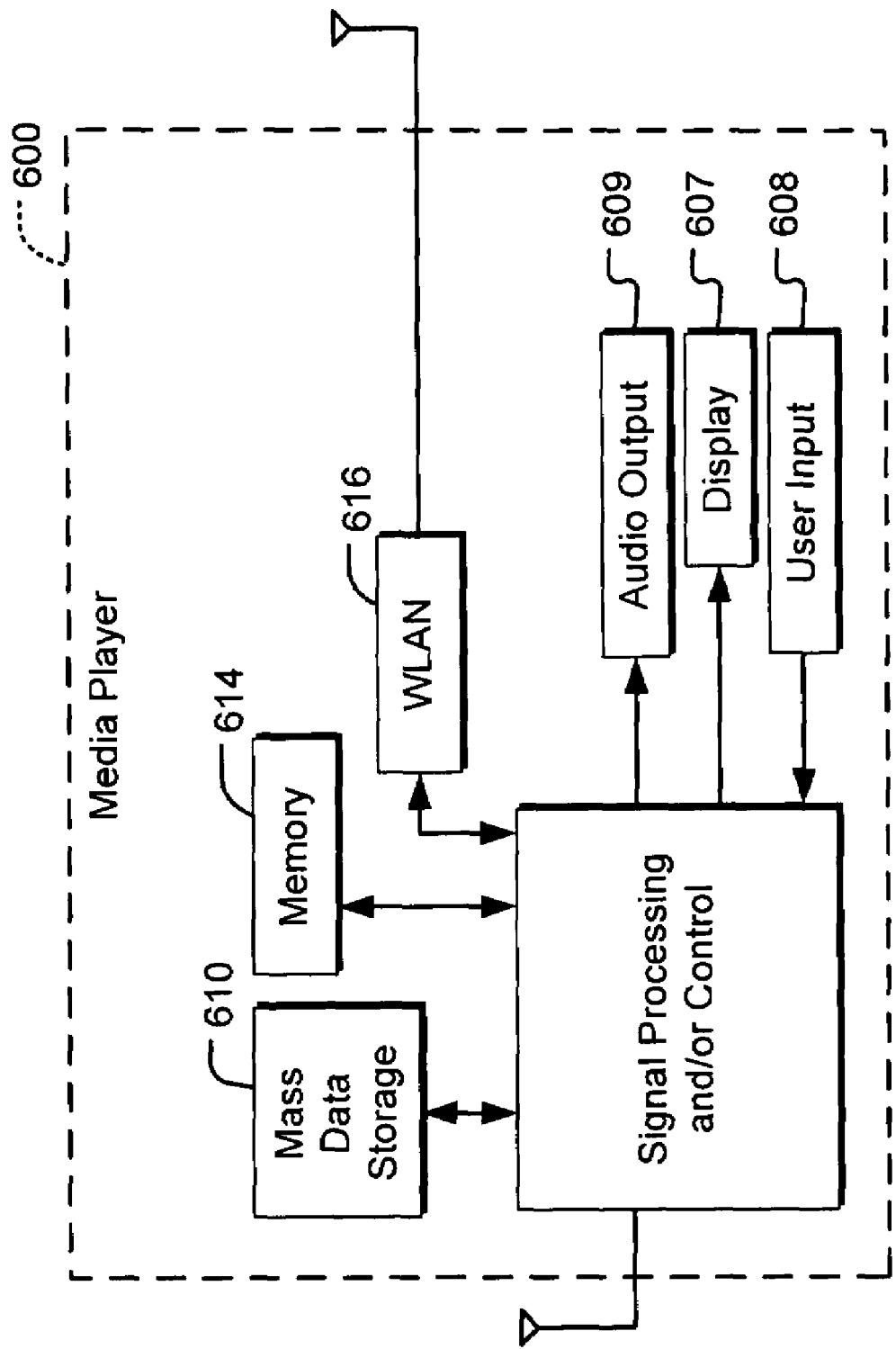
FIG. 6G is a block diagram of the invention in a media player.

Referring now to FIG. 6G, the present invention may be embodied as an over-power detector in a media player 600. The present invention may implement either or both signal processing and/or control circuits, which are generally identified in FIG. 6G at 604, a WLAN interface and/or mass data storage of the media player 600. In some implementations, media player 600 includes a display 607 and/or a user input 608 such as a keypad, touchpad and the like. In some implementations, media player 600 may employ a graphical user interface (GUI) that typically employs menus, drop down menus, icons and/or a point-and-click interface via display 607 and/or user input 608. Media player 600 further includes an audio output 609 such as a speaker and/or audio output jack. Signal processing and/or control circuits 604 and/or other circuits (not shown) of media player 600 may process data, perform coding and/or encryption, perform calculations, format data and/or perform any other media player function.

Media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8"Media player 600 may be connected to memory 614 such as RAM, ROM, low latency nonvolatile memory such as flash memory and/or other suitable electronic data storage. Media player 600 also may support connections with a WLAN via a WLAN network interface 616. Still other implementations in addition to those described above are contemplated.

The invention has been described above with respect to particular illustrative embodiments. It is understood that the invention is not limited to the above-described embodiments and that various changes and modifications may be made by those skilled in the relevant art without departing from the spirit and scope of the invention.

What is claimed is:

1. An over-power detector for detecting an over-power condition of an electrical apparatus powered by power from an AC power source, the over-power detector comprising:
   a voltage peak detector for detecting a peak voltage of the AC power source, and for outputting a signal indicative of the level of the peak voltage, the voltage peak detector including a comparator for comparing a voltage corresponding to voltage on the AC power source with a settable voltage threshold; and
   an over-current detector for detecting whether current used by the apparatus exceeds a settable current threshold, wherein the current threshold is set in accordance with the signal indicative of the level of the peak voltage, and for outputting an over-power signal if current used by the apparatus exceeds the settable current threshold.

2. An over-power detector according to claim 1, further comprising:
   a register for outputting a sequence in correspondence to an output from said comparator, and a voltage threshold selector which sets the settable voltage threshold based on the sequence output from said register and provides the settable voltage threshold to said comparator.

3. An over-power detector according to claim 2, wherein said over-current detector includes a second comparator and a current threshold selector, wherein said current threshold selector sets the settable current threshold based on the sequence output from said register and provides the settable current threshold to said second comparator.

4. An over-power detector for detecting an over-power condition of an electrical apparatus powered by power from an AC power source, the over-power detector comprising:

voltage peak detecting means for detecting a peak voltage of the AC power source, and for outputting a signal indicative of the level of the peak voltage, the voltage peak detecting means including comparator means for comparing a voltage corresponding to voltage on the AC power source with a settable voltage threshold; and over-current detecting means for detecting whether current used by the apparatus exceeds a settable current threshold, wherein the current threshold is set in accordance with the signal indicative of the level of the peak voltage, and for outputting an over-power signal if current used by the apparatus exceeds the settable current threshold.

5. An over-power detector according to claim 4, further comprising:

register means for outputting a sequence in correspondence to an output from said comparator means, and voltage threshold selecting means which sets the settable voltage threshold based on the sequence output from said register means and provides the settable voltage threshold to said comparator means.

6. An over-power detector according to claim 5, wherein said over-current detecting means includes second comparator means and current threshold selecting means, wherein said current threshold selecting means sets the settable current threshold based on the sequence output from said register means and provides the settable current threshold to said second comparator means.

7. A method for detecting an over-power condition of an electrical apparatus powered by power from an AC power source, the method comprising:

detecting a peak voltage of the AC power source, including comparing a voltage corresponding to voltage on the AC power source with a settable voltage threshold;

outputting a signal indicative of the level of the peak voltage;

detecting whether current used by the apparatus exceeds a settable current threshold, wherein the current threshold is set in accordance with the signal indicative of the level of the peak voltage; and outputting an over-power signal if current used by the apparatus exceeds the settable current threshold.

8. A method according to claim 7, further comprising outputting a sequence in correspondence to an output from said comparing, and providing the settable voltage threshold to said comparing based on the outputted sequence.

9. A method according to claim 8, wherein said current detecting includes selecting the settable current threshold based on the outputted sequence, and comparing the current used by the apparatus with the selected current threshold.

* * * * *